US008445390B1

(12) United States Patent
 Sasagawa

(10) Patent No.: US 8,445,390 B1
(45) Date of Patent: May 21, 2013

(54) PATTERNING OF ANTISTICTION FILMS FOR ELECTROMECHANICAL SYSTEMS DEVICES

(75) Inventor: Teruo Sasagawa, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 13/294,114

(22) Filed: Nov. 10, 2011

(51) Int. Cl.
 *H01L 21/302* (2006.01)
 *H01L 21/461* (2006.01)

(52) U.S. Cl.
 USPC ............ 438/707; 257/E21.218; 257/E21.347; 257/E21.475; 257/E21.517; 438/694; 438/706; 438/709; 438/710

(58) Field of Classification Search
 USPC .................... 257/E21.218, E21.347, E21.475, 257/E21.517; 438/694, 706, 707, 709, 710
 See application file for complete search history.

(56) References Cited

U.S. PATENT DOCUMENTS

| 6,040,937 | A | 3/2000 | Miles |
| 6,674,562 | B1 | 1/2004 | Miles |
| 6,815,361 | B1 | 11/2004 | Bae et al. |
| 7,074,637 | B2 * | 7/2006 | Lutz et al. ........................ 438/50 |
| 7,123,216 | B1 | 10/2006 | Miles |
| 7,327,510 | B2 | 2/2008 | Cummings et al. |
| 8,105,496 | B2 * | 1/2012 | Miles ................................ 216/2 |
| 2003/0152756 | A1 | 8/2003 | Yamada et al. |
| 2004/0100680 | A1 | 5/2004 | Huibers et al. |
| 2004/0224523 | A1 * | 11/2004 | Bae et al. ........................ 438/706 |
| 2005/0157376 | A1 | 7/2005 | Huibers et al. |
| 2008/0108163 | A1 | 5/2008 | Chen et al. |
| 2008/0111203 | A1 | 5/2008 | Pan et al. |
| 2010/0314724 | A1 * | 12/2010 | Hancer ........................ 257/632 |
| 2012/0248460 | A1 * | 10/2012 | Abraham et al. ............... 257/77 |

FOREIGN PATENT DOCUMENTS

JP 3071991 A 3/1991

OTHER PUBLICATIONS

International Search Report and Written Opinion—PCT/US2012/063678—ISA/EPO—Mar. 26, 2013.
Kirkwood S et al., "Direct writing of Self-assembled monoplayers on Gold Coated Substrates using a CW argon Laser", MEMS, NANO and Smart Systems, 2003. Proceedings. International Conference NCE on Jul. 20-23, 2003, Piscataway, NJ, USA, IEEE, Jul. 20, 2003, pp. 48-52, XP010650499.

* cited by examiner

*Primary Examiner* — Asok K Sarkar
(74) *Attorney, Agent, or Firm* — Knobbe, Martens, Olson & Bear, LLP

(57) ABSTRACT

A laser absorption layer is first selectively formed in a seal pattern region surrounding an array of electromechanical systems elements, followed by depositing an antistiction layer as a blanket layer over the substrate and the laser absorption layer. The antistiction layer is then selectively removed from the seal pattern using a laser. An epoxy sealing material is provided in the seal pattern where the antistiction layer was removed and a backplate is sealed to the substrate using epoxy.

17 Claims, 12 Drawing Sheets

Common Voltages

| | $VC_{ADD\_H}$ | $VC_{HOLD\_H}$ | $VC_{REL}$ | $VC_{HOLD\_L}$ | $VC_{ADD\_L}$ |
|---|---|---|---|---|---|
| $VS_H$ | Stable | Stable | Relax | Stable | Actuate |
| $VS_L$ | Actuate | Stable | Relax | Stable | Stable |

Segment Voltages

PATTERNING OF ANTISTICTION FILMS FOR ELECTROMECHANICAL SYSTEMS DEVICES

TECHNICAL FIELD

This disclosure relates to electromechanical systems devices.

DESCRIPTION OF THE RELATED TECHNOLOGY

Electromechanical systems (EMS) include devices having electrical and mechanical elements, actuators, transducers, sensors, optical components (such as mirrors and optical film layers) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Antistiction layers can be used to keep the conductive plates from sticking to one another during the operation of the electromechanical systems device.

SUMMARY

The systems, methods and devices of the disclosure each have several innovative aspects, no single one of which is solely responsible for the desirable attributes disclosed herein.

One innovative aspect of the subject matter described in this disclosure can be implemented in a method for selectively removing an antistiction layer in an electromechanical systems apparatus including: providing a substrate having a device with a patterned laser absorption layer surrounding the device in a seal pattern; depositing an antistiction layer as a blanket layer over the substrate and over the laser absorption layer after providing the substrate with the patterned laser absorption layer; selectively removing the antistiction layer from the seal pattern using a laser; and sealing the device with epoxy in regions where the antistiction layer was removed.

Selectively removing the antistiction layer can include selectively removing the laser absorption layer using the laser. The antistiction layer can include an ALD layer and a SAM layer.

One innovative aspect of the subject matter described in this disclosure can be implemented in an apparatus including a substrate; at least one electromechanical systems element on the substrate; an epoxy sealing material surrounding the at least one electromechanical systems element; a backplate spaced over the substrate to form a package; and an antistiction layer formed on the substrate inside the package and outside the epoxy seal, wherein no antistiction layer exists between the epoxy sealing material and the substrate.

In some implementations a laser blocking layer patterned to underlie the epoxy sealing material can be used. The laser blocking layer can be a quarter-wavelength dielectric stack configured to reflect the wavelength of the laser.

One innovative aspect of the subject matter described in this disclosure can be implemented in a apparatus that includes a substrate; a plurality of electromechanical systems elements arranged in an array on the substrate; a means for reducing adhesion over the array and outside of the array; a means for sealing in a sealing pattern surrounding the array; and a backplate sealed to the substrate by the means for sealing.

In some implementations, the means for sealing includes epoxy and an absence of the means for reducing adhesion in that region. In some implementations, the means for reducing adhesion includes a self-assembled monolayer (SAM). In some implementations the means for reducing adhesion includes a self-assembled monolayer (SAM) and a layer formed by atomic layer deposition.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
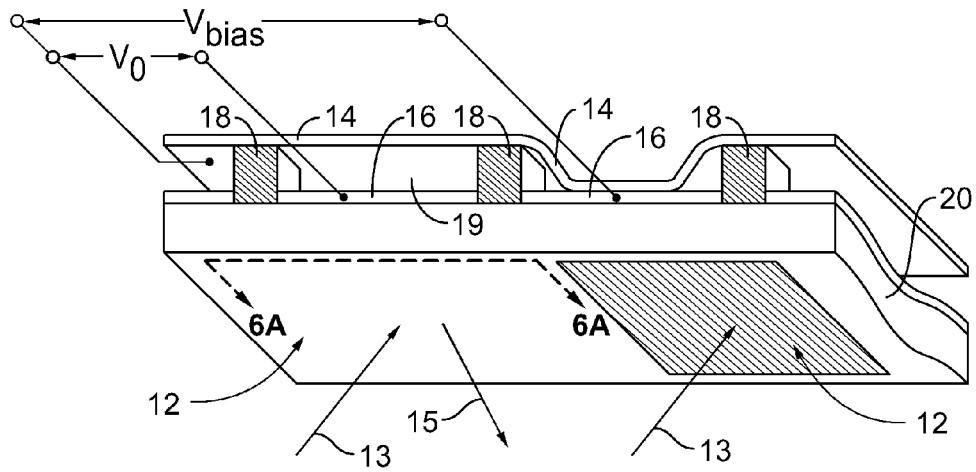
FIG. 1 shows an example of an isometric view depicting two adjacent pixels in a series of pixels of an interferometric modulator (IMOD) display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Methods are disclosed for applying a laser absorption layer in a seal pattern to the peripheral areas of an electromechanical systems device prior to forming an antistiction layer. The antistiction layer is then formed over the laser absorption layer and other areas of the apparatus, including over an array of electromechanical systems elements. The antistiction layer can include, e.g., a self-assembled monolayer (SAM). The antistiction layer can additionally include a dielectric layer to promote formation of the SAM. Laser energy is then used to remove the laser absorption layer from the seal areas. As a result, the laser removes the antistiction layer from the seal pattern area. The laser can remove the laser absorption layer thus remove the antistiction layer in a manner similar to lift-off patterning. A patterned reflector layer can also be used in the seal areas to protect underlying structures from excess laser energy. Epoxy or other sealant can then be used on the seal areas of the electromechanical systems device with improved sealing properties to the substrate, and a back plate sealed thereover.

Particular implementations of the subject matter described in this disclosure can be implemented to realize one or more of the following potential advantages.

The antistiction layer can prevent sealing means, such as epoxy, from forming a strong and stable bond to the electromechanical systems device. Removing the antistiction layer can result in an improved seal between the backplate and surface of the periphery of the electromechanical systems device. The antistiction layers are thin and can be difficult to remove without damaging the electromechanical systems device because the electromechanical systems devices are sensitive and easily damaged after release or removal of the sacrificial layers(s). Many common methods for patterning the antistiction layers, such as photolithographic masking and etching, cannot be used because they will damage the electromechanical systems devices after release. It is also difficult to remove the antistiction layers with lasers because they are very thin and effectively transparent to laser energy. The use of the laser absorption layer can enable the use of a laser to remove the thin antistiction layer from undesired areas. The laser absorption layer can be patterned in the seal regions and absorb selectively applied laser energy, thus removing antistiction layer without a mask, and prevent damage to underlying structures, such as interconnects, and an additional reflective layer can further protect underlying structures. The removal of the antistiction layer can lead to an improved seal between the backplate and the cleaned surface of the device.

An example of a suitable MEMS device or apparatus, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, e.g., by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, e.g., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent electromechanical systems elements in the form of interferometric modulators 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the pixel 12 on the left. Although not illustrated in detail, it will be understood by a person having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the pixel 12 on the viewing or substrate side of the device.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be less than 10,000 Ångstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the pixel 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated pixel 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
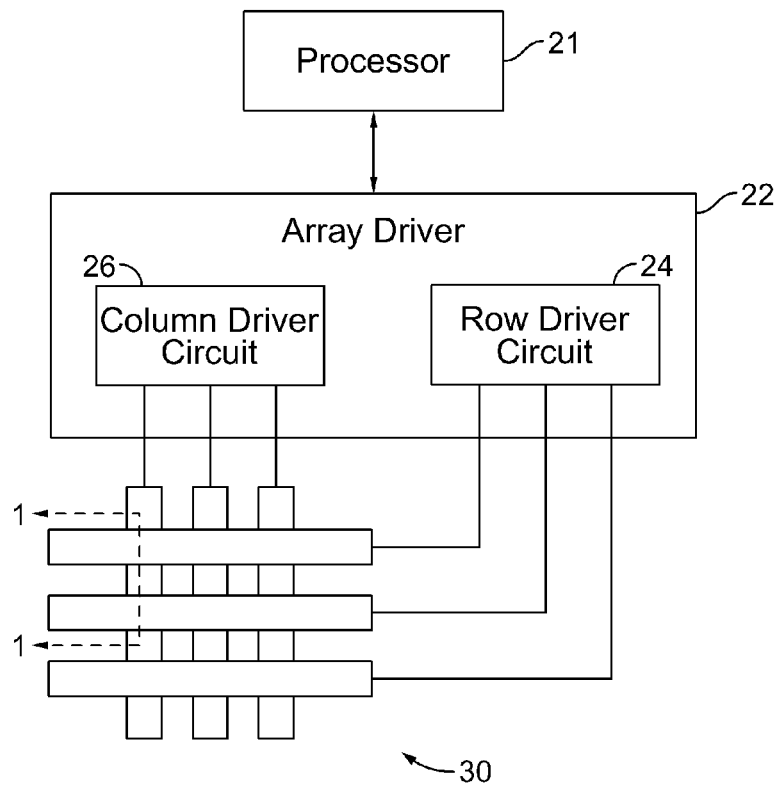
FIG. 2 shows an example of a system block diagram illustrating an electronic device incorporating a 3×3 interferometric modulator display.

FIG. 2 shows an example of a system block diagram illustrating an electronic device incorporating a 3×3 interferometric modulator display. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
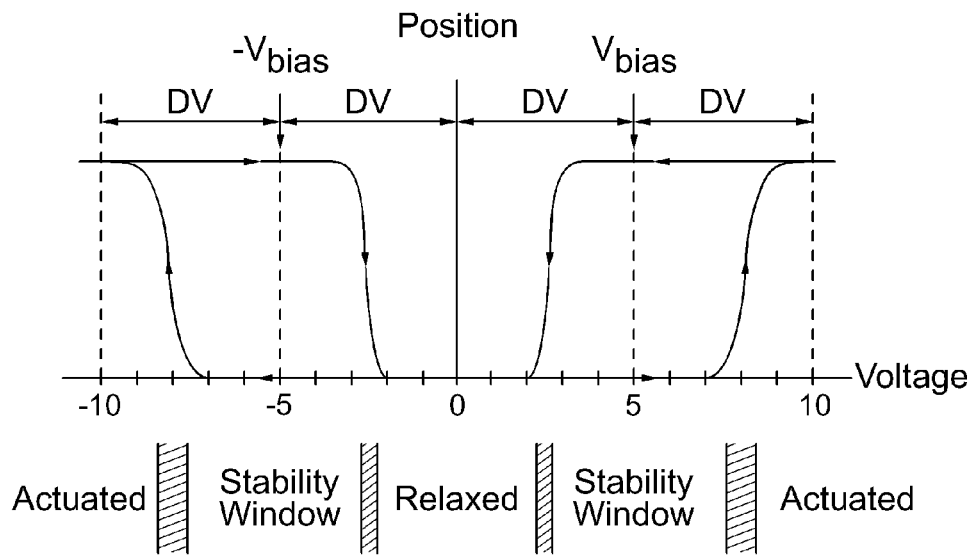
FIG. 3 shows an example of a diagram illustrating movable reflective layer position versus applied voltage for the interferometric modulator of FIG. 1.
FIG. 4 shows an example of a table illustrating various states of an interferometric modulator when various common and segment voltages are applied.

FIG. 3 shows an example of a diagram illustrating movable reflective layer position versus applied voltage for the interferometric modulator of FIG. 1. For MEMS interferometric modulators, the row/column (i.e., common/segment) write procedure may take advantage of a hysteresis property of the MEMS elements as illustrated in FIG. 3. An interferometric modulator may require, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10-volts, however, the movable reflective layer does not relax completely until the voltage drops below 2-volts. Thus, a range of voltage, approximately 3 to 7-volts, as shown in FIG. 3, exists where there is a window of applied voltage within which the element is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10-volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7-volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment" voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an interferometric modulator when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, in this example the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{DD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{DD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which always produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation that could occur after repeated write operations of a single polarity.

Figure 5A:
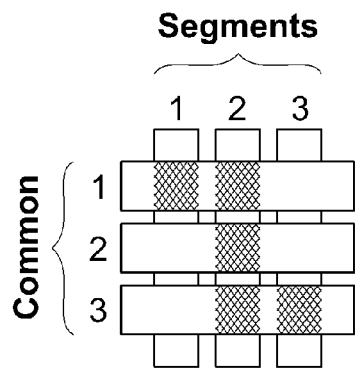
FIG. 5A shows an example of a diagram illustrating a frame of display data in the 3×3 interferometric modulator display of FIG. 2.
Figure 5B:
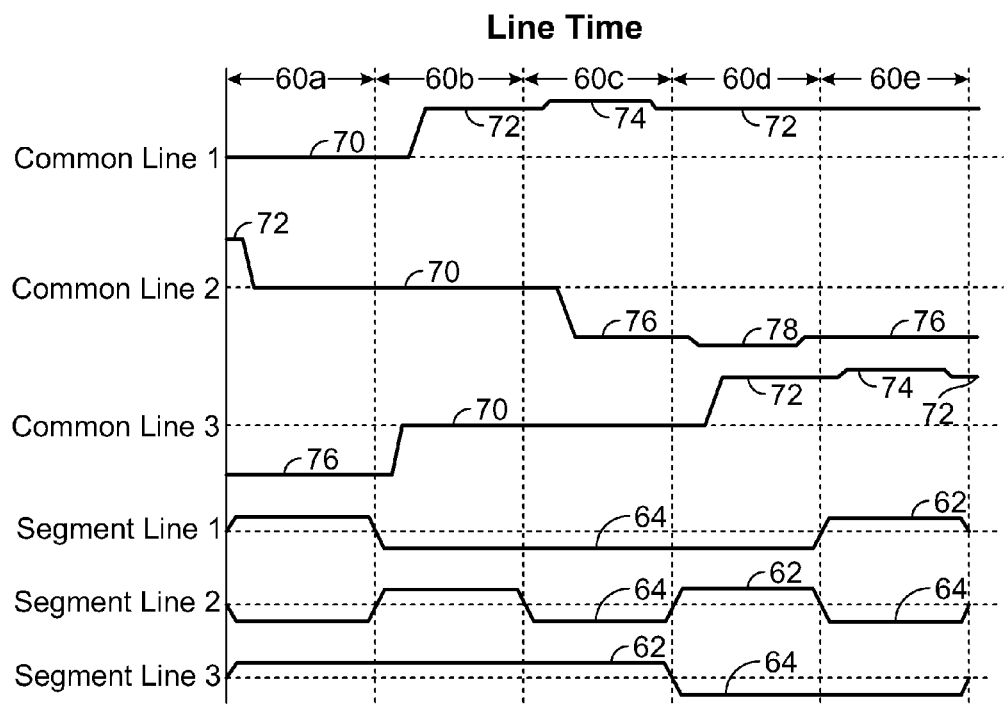
FIG. 5B shows an example of a timing diagram for common and segment signals that may be used to write the frame of display data illustrated in FIG. 5A.

FIG. 5A shows an example of a diagram illustrating a frame of display data in the 3×3 interferometric modulator display of FIG. 2. FIG. 5B shows an example of a timing diagram for common and segment signals that may be used to write the frame of display data illustrated in FIG. 5A. The signals can be applied to, e.g., the 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a: a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$—relax and $VC_{HOLD\_L}$—stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a characteristic threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the necessary line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
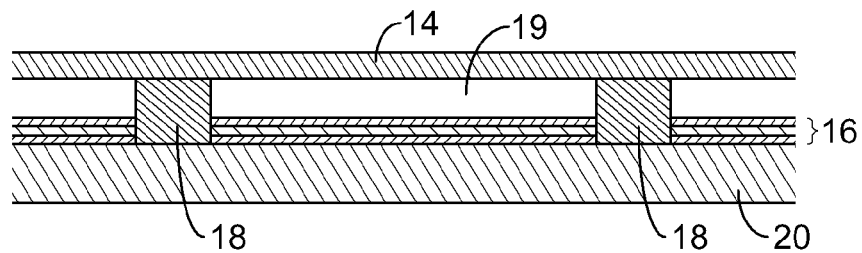
FIG. 6A shows an example of a partial cross-section of the interferometric modulator display of FIG. 1.
Figure 6B:
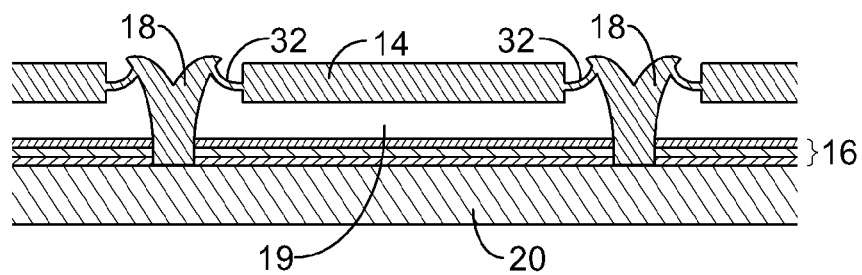
FIGS. 6B-6E show examples of cross-sections of varying implementations of interferometric modulators.
Figure 6C:
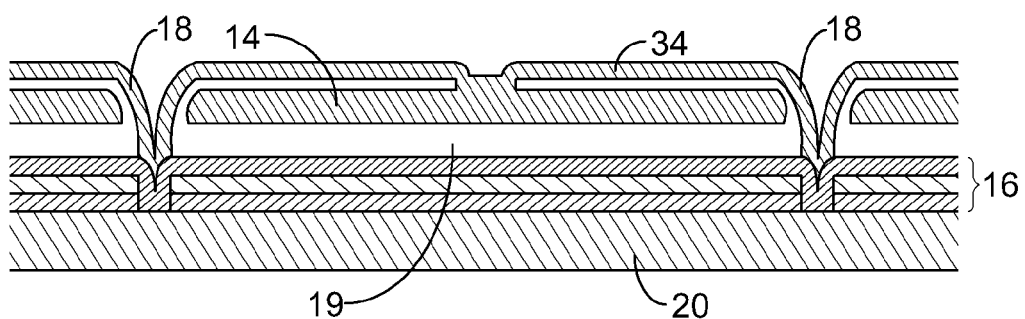

The details of the structure of interferometric modulators that operate in accordance with the principles set forth above may vary widely. For example, FIGS. 6A-6E show examples of cross-sections of varying implementations of interferometric modulators, including the movable reflective layer 14 and its supporting structures. FIG. 6A shows an example of a partial cross-section of the interferometric modulator display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as supports or support posts 18. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
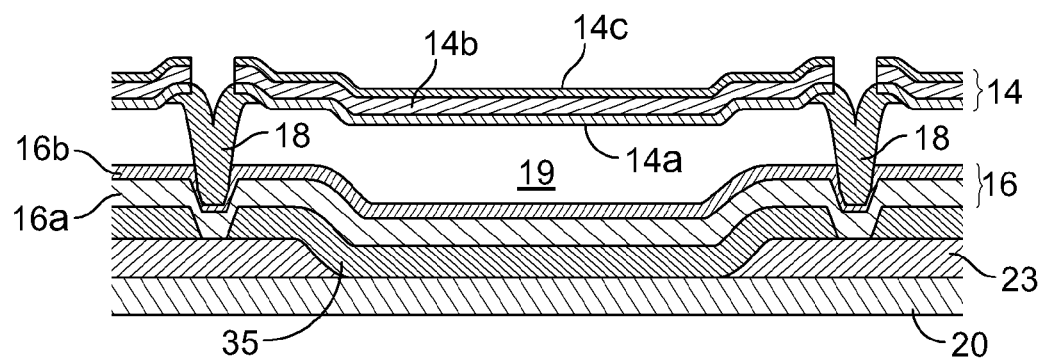

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, e.g., an aluminum (Al) alloy with about 0.5% copper (Cu), or another reflective metallic material. Employing conductive layers 14a and 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under the support posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, a layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, carbon tetrafluoride ($CF_4$) and/or oxygen ($O_2$) for the MoCr and $SiO_2$ layers and chlorine ($Cl_2$) and/or boron trichloride ($BCl_3$) for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate electrodes or conductor(s) in the optical stack 16 (e.g., the absorber layer 16a) from the conductive layers in the black mask 23.

Figure 6E:
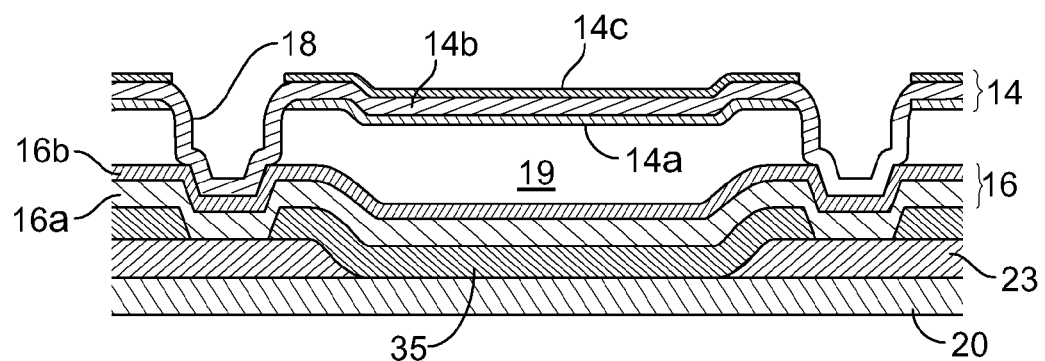

FIG. 6E shows another example of an IMOD, where the movable reflective layer 14 is self supporting. In contrast with FIG. 6D, the implementation of FIG. 6E does not include separately formed support posts. Instead, the movable reflective layer 14 contacts the underlying optical stack 16 at multiple locations to create integrated supports 18, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a stationary electrode and as a partially reflective layer.

In implementations such as those shown in FIGS. 6A-6E, the IMOD displays function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 that provides the ability to separate the optical properties of the modulator from the electromechanical properties of the modulator, such as voltage addressing and the movements that result from such addressing. Additionally, the implementations of FIGS. 6A-6E can simplify processing, such as, e.g., patterning.

Figure 7:
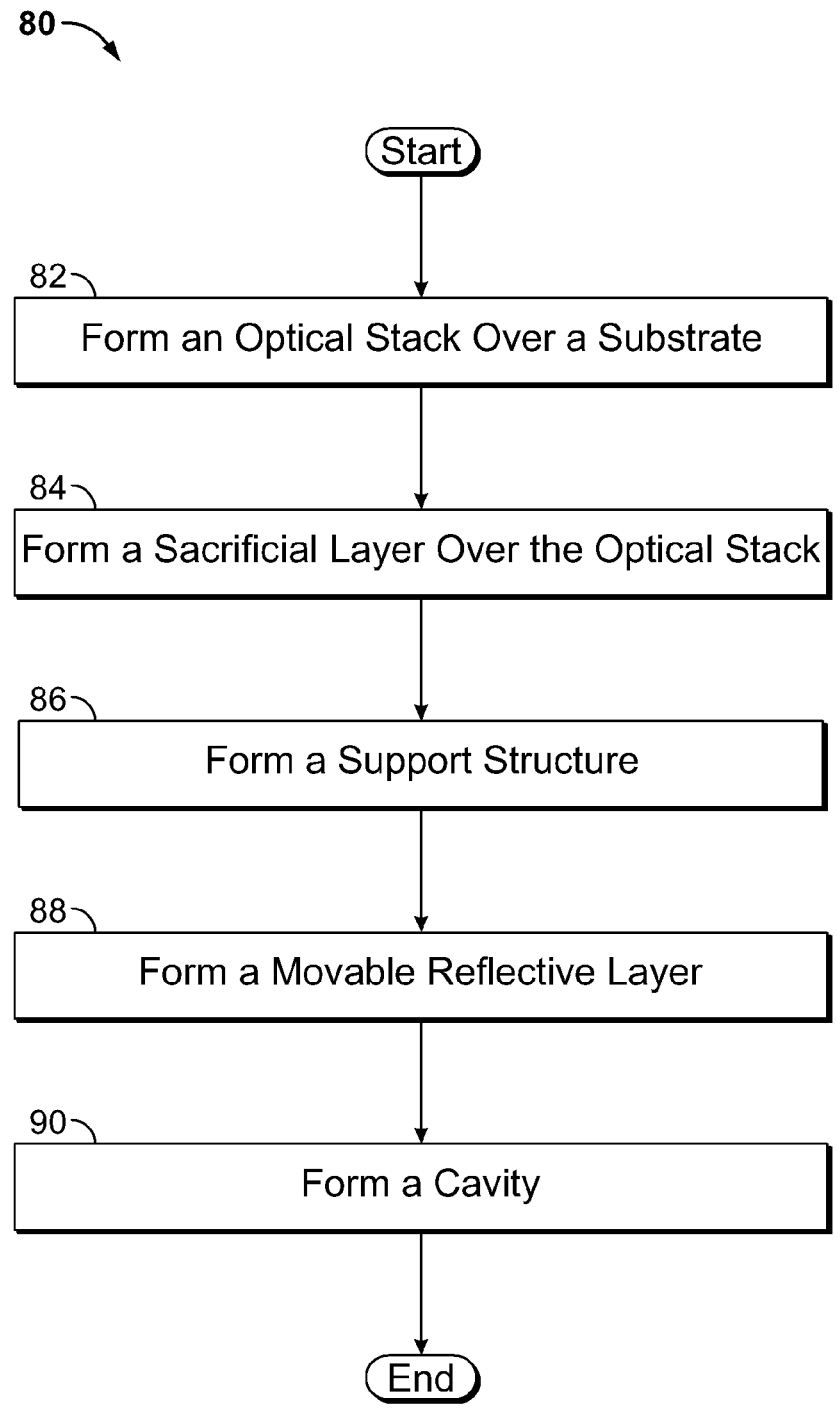
FIG. 7 shows an example of a flow diagram illustrating a manufacturing process for an interferometric modulator.
Figure 8A:
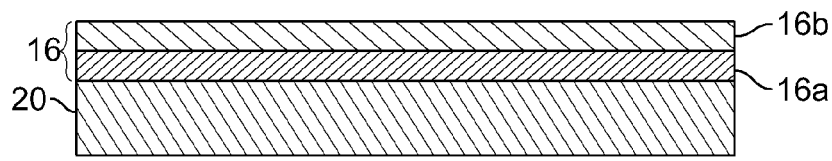
FIGS. 8A-8E show examples of cross-sectional schematic illustrations of various stages in a method of making an interferometric modulator.

FIG. 7 shows an example of a flow diagram illustrating a manufacturing process 80 for an interferometric modulator, and FIGS. 8A-8E show examples of cross-sectional schematic illustrations of corresponding stages of such a manufacturing process 80. In some implementations, the manufacturing process 80 can be implemented to manufacture, e.g., interferometric modulators of the general type illustrated in FIGS. 1 and 6A-6E, in addition to other blocks not shown in FIG. 7. With reference to FIGS. 1, 6A-6E, and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
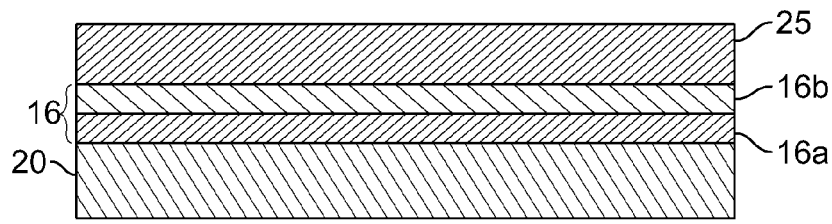

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting interferometric modulators illustrated in FIGS. 1 and 6A-6E. FIG. 8B illustrates a partially fabricated device including a sacrificial layer 25 formed over the optical stack 16. The formation of the sacrificial layer 25 over the optical stack 16 may include deposition of a xenon difluoride ($XeF_2$)-etchable material, such as molybdenum (Mo) or amorphous silicon (a-Si), in a thickness selected to provide, after subsequent removal, a gap or cavity 19 (see also FIGS. 1, 6A-6E, and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
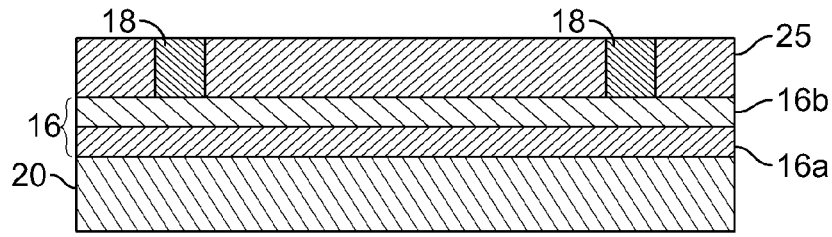

The process 80 continues at block 86 with the formation of a support structure e.g., a post 18 as illustrated in FIGS. 1, 6A, 6D, and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a masking and etching process, but also may be performed by alternative patterning methods.

Figure 8D:
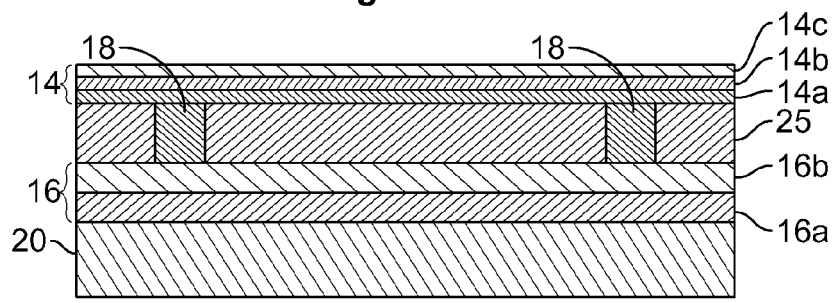
Figure 8E:
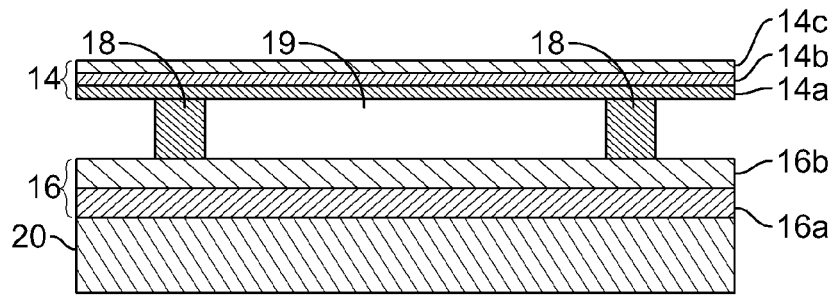

The process 80 continues at block 88 with the formation of a movable reflective layer or membrane such as the movable reflective layer 14 illustrated in FIGS. 1, 6A-6E, and 8D. The movable reflective layer 14 may be formed by employing one or more deposition steps, e.g., reflective layer (e.g., aluminum, aluminum alloy) deposition, along with one or more patterning, masking, and/or etching steps. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a and 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 may also be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6A-6E, and 8E. The cavity 19 may be formed by exposing the sacrificial material 25 (deposited at block 84) to an etchant. For example, an etchable sacrificial material such as Mo or amorphous Si may be removed by dry chemical etching, e.g., by exposing the sacrificial layer 25 to a gaseous or vaporous etchant, such as vapors derived from solid $XeF_2$, for a period of time that is effective to remove the desired amount of material, typically selectively removed relative to the structures surrounding the cavity 19. Other etching methods, e.g. wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

In electromechanical systems, such as the IMODs described above, it is often desirable to form an antistiction layer inside the cavity 19 to reduce friction and sticking between the movable electrode (e.g., the reflective layer 14) and the stationary electrode (e.g., conductive layers(s) of the optical stack 16). In some implementations the antistiction layer has a total thickness of less than about 110 Å. Reducing friction and sticking between the movable electrode and the stationary electrode improves device performance and the life span of the device. In some implementations the antistiction layer can include multiple layers.

In some implementations a self-assembled monolayer (SAM) is used in the antistiction layer. In some implementations the SAM can be formed on top of a dielectric layer, for example an oxide layer, to improve adhesion of the SAM if the adhesion of the SAM is insufficient without the underlying dielectric layer. In some implementations, the term "antistiction layer" includes both the SAM layer and the underlying dielectric layer. The dielectric layer can be used to nucleate or promote the formation of the SAM. In some implementations the SAM can be formed from decyltrichlorosilane (DTS). Other compounds capable of forming a SAM layer may also be used. In some implementations the SAM layer is formed from an organic monomer having a hydrophobic end and a hydrophilic end. In some implementations the SAM layer can be formed by vapor phase deposition or by dipping in a liquid containing a monomer. In some implementations the thickness of the SAM layer is less than about 50 Å, or less than about 20 Å.

In some implementations a thin dielectric layer is first formed in the cavity. In some implementations the dielectric layer has a thickness of less than about 90 Å or less than about 60 Å. Additional layers can be formed on top of the dielectric layer as part of the antistiction layer. In some implementations the dielectric layer is aluminum oxide ($Al_2O_3$). In some implementations the dielectric layer can be formed by atomic layer deposition (ALD). For example, trimethyl aluminum (TMA) and water can be alternately pulsed to form an aluminum oxide layer in an ALD process.

In some implementations the antistiction layer is a blanket layer. For example, the antistiction layer can coat the inside of the cavity 19 along with other areas of the partially fabricated IMOD device.

The antistiction layer typically is formed over all of the surfaces of the device, including the device substrate on which the device is formed. In some implementations, the device includes a plurality or an array of EMS devices, such as an array of MEMS display elements. Furthermore, in some implementations, the device substrate may include a plurality of devices formed thereon, with each device including an array of EMS devices. The properties of the antistiction layer can make it more difficult to seal a back plate or lid onto the substrate over the device using a sealant. For example, the antistiction layer makes it more difficult to seal a back plate or lid around the device using epoxy. The resulting epoxy seal can also be weaker than desired. As a result, it is desirable to remove the antistiction layer from the sealing pattern area on the device substrate around the device. While this disclosure can apply generally to EMS devices, the subsequent discussion will focus on implementations using an IMOD device. It will be understood that the term "IMOD device" can include an array of IMOD display elements, such as in a display. "Substrate" can refer to the underlying glass substrate (in the example of an IMOD implementation) but can also include any integrated layers formed thereover, depending upon the context. It will be understood that the antistiction and sealants layers will typically be formed over deposited layers on top of the substrate, but according to conventional terminology is still said to be deposited on or over the substrate.

Antistiction layers can be removed using UV ozone processes. However, the use of a UV ozone process does not remove aluminum oxide or other materials that can be part of the antistiction layer. The remaining aluminum oxide or other material can interfere with the epoxy seal. In addition, ozone can diffuse into the cavity of the IMOD device and damage the device, for example by removing the SAM coating from an internal cavity. The thin aluminum oxide layer can also be difficult to remove using laser energy because it is very thin, for example with a thickness of less than about 50 Å, and thus does not readily absorb laser energy.

In some implementations a laser absorption layer is formed on the device substrate of the partially fabricated IMOD device in a seal pattern. The laser absorption layer can be formed before or after release, but is formed prior to the antistiction layer.

Figure 9:
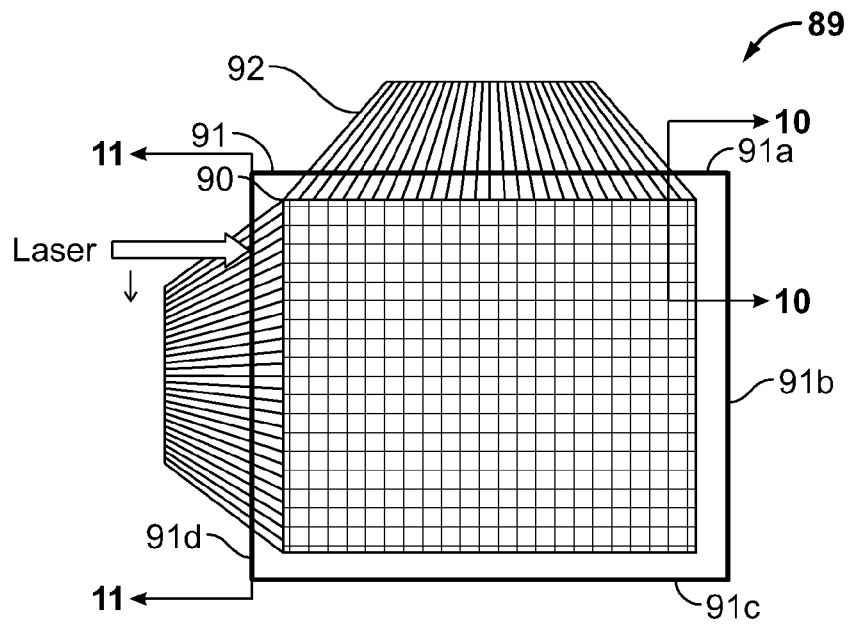
FIG. 9 shows an example of a plan view of a device including an array of electromechanical systems elements.

FIG. 9 shows an example of a plan view of a portion of a device including an array of electromechanical systems elements, such as an array of IMOD display elements, formed on a device substrate. The array 90 forms part of a device 89, in this case a display device, and is surrounded by a laser absorption layer 91 in a seal pattern. As illustrated in FIG. 9, some portions of the device 89 extend beyond the absorption layer 91 surrounding the device, for example interconnects 92 leading from row and column electrodes in the array 90. The interconnects 92 may be used for electrically connecting the row and column electrodes to row and column drivers and other circuitry, with such circuitry either being integrated onto to the device substrate or attached in subsequent processes. The interconnects 92 are typically metallic and can be sensitive to laser energy. In some implementations the laser power, laser power density, or laser wavelength is selected such that it removes the laser absorption layer 91 and does not damage the interconnect lines 92 or other parts of the device underlying the seal pattern. The region in which the array 90 is formed can also be referred to as an active region.

Figure 10:
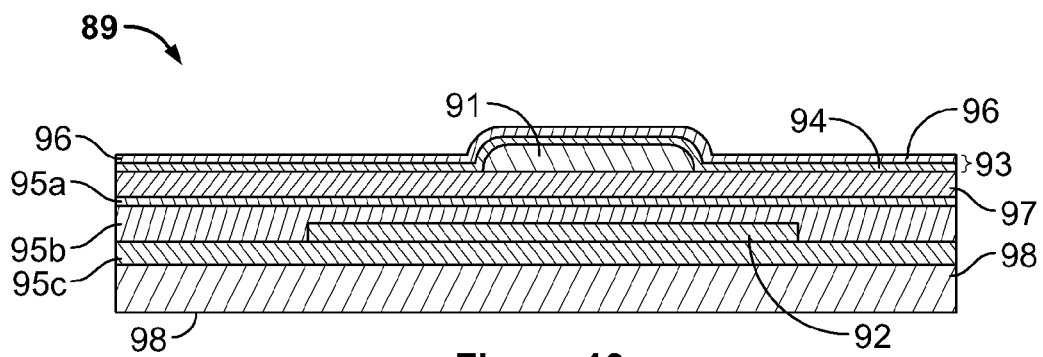
FIG. 10 shows an example of a cross section of a peripheral portion of the electromechanical systems device, taken along lines 10-10 of FIG. 9.

FIG. 10 shows an example of a cross section of a peripheral portion of the device, taken along lines 10-10 of FIG. 9. The cross section shows the laser absorption layer 91 under an antistiction layer 93. In this example, the antistiction layer 93 includes an aluminum oxide layer 94 and a self-assembled monolayer (SAM) 96. The antistiction layer 93 is blanket deposited over both the periphery and the array 90 (FIG. 9) of the device 89. FIG. 10 also shows the laser absorption layer 91 crossing over an interconnect line 92, with an intervening insulating layer 97 (such as, silicon oxynitride (SiON)), and an underlying device substrate 98 (such as glass). FIG. 10 also shows insulating layers 95a, 95b, and 95c above, adjacent, and below the interconnect line 92 that can serve functions in the device 89 or the process of forming it, such as electrical isolation of interconnects 92, etch stop and/or barrier/passivation functions.

Figure 11:
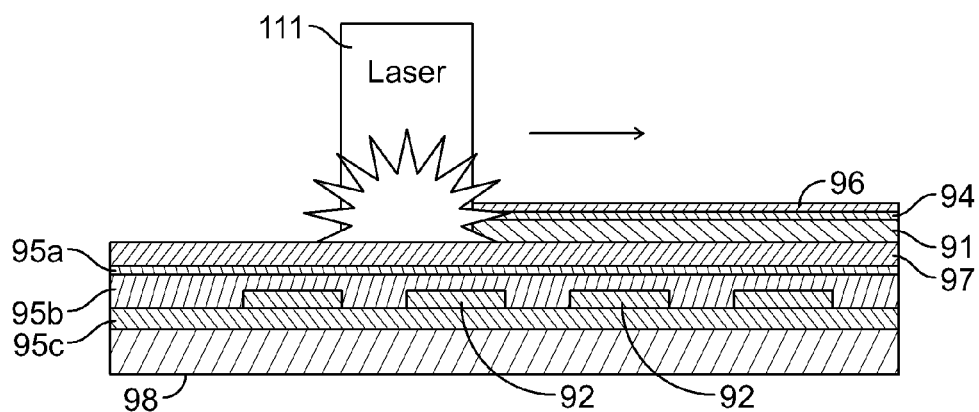
FIG. 11 shows an example of a cross section of the peripheral portion of the device, taken along lines 11-11 of FIG. 9, showing laser scanning along a laser absorption layer.

FIG. 11 shows an example of a cross section of the peripheral portion of the device, taken along lines 11-11 of FIG. 9, showing a laser scanning path along a laser absorption layer. The laser beam 111 is directed at the patterned laser absorption layer 91. The laser energy is absorbed or suscepted by the laser absorption layer 91 and the overlying antistiction layer 93 is thereby removed. In the illustrated example, the laser energy is tuned such that it evaporates or ablates the laser absorption layer 91 thereby removing it from the surface of the array. In some implementations the laser absorption layer 91 is removed by ablation. When the laser absorption layer 91 is removed the overlying portions of the antistiction layer 93, including the aluminum oxide 94 and the SAM 96, are also removed, thereby leaving a clean surface of the insulating layer 97 that can be sealed using epoxy.

FIG. 11 is a cross-section along the length of the laser absorption layer 91 and shows the laser beam 111 scanning across the length of the laser absorption layer 91, removing it and the overlying portions of the antistiction layer 93 as the laser beam 111 scans. For the rectangular shaped laser absorption layer 91 of FIG. 9, scanning laser beams along all four sides (91a, 91b, 91c, and 91d) will remove the antistiction layer 93 from the sealing region surrounding the array 90 of IMODs.

Figure 12:
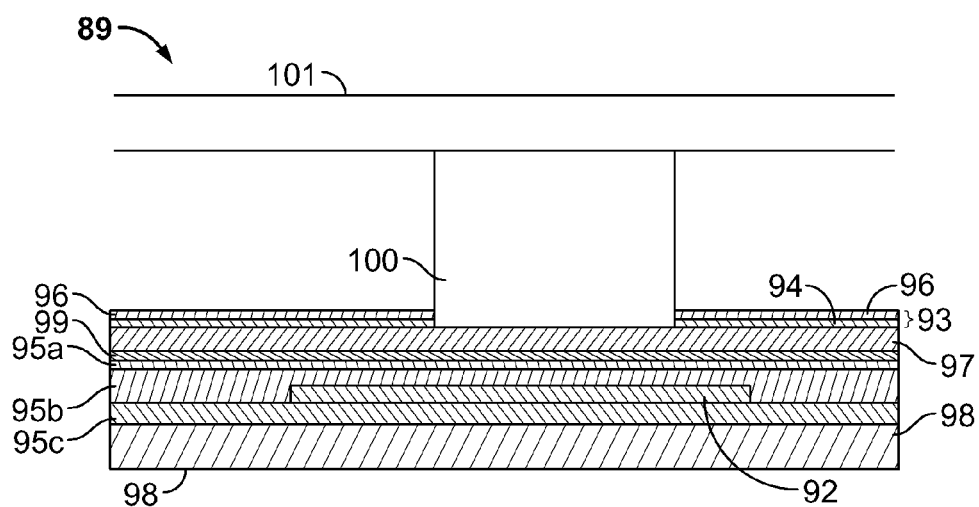
FIG. 12 is a cross-section of a peripheral portion of the device with the antistiction layer removed from a sealing pattern of the device, epoxy added to the sealing pattern, and a back plate sealed by the epoxy to the substrate.

FIG. 12 is a cross-section of a peripheral portion of the device in another implementation with the antistiction layer removed from a sealing pattern around the device, epoxy added to the sealing pattern, and a back plate sealed by the epoxy to the device substrate 98. Epoxy 100 is used to seal the backplate 101 to the device substrate 98. A blocker layer 99 is also shown located under the seal region of the device 89 where the absorption layer 91 was located prior to removal. The blocker layer 99 can be used to reflect laser energy and prevent damage to the underlying structures, such as interconnects 92.

Figure 13:
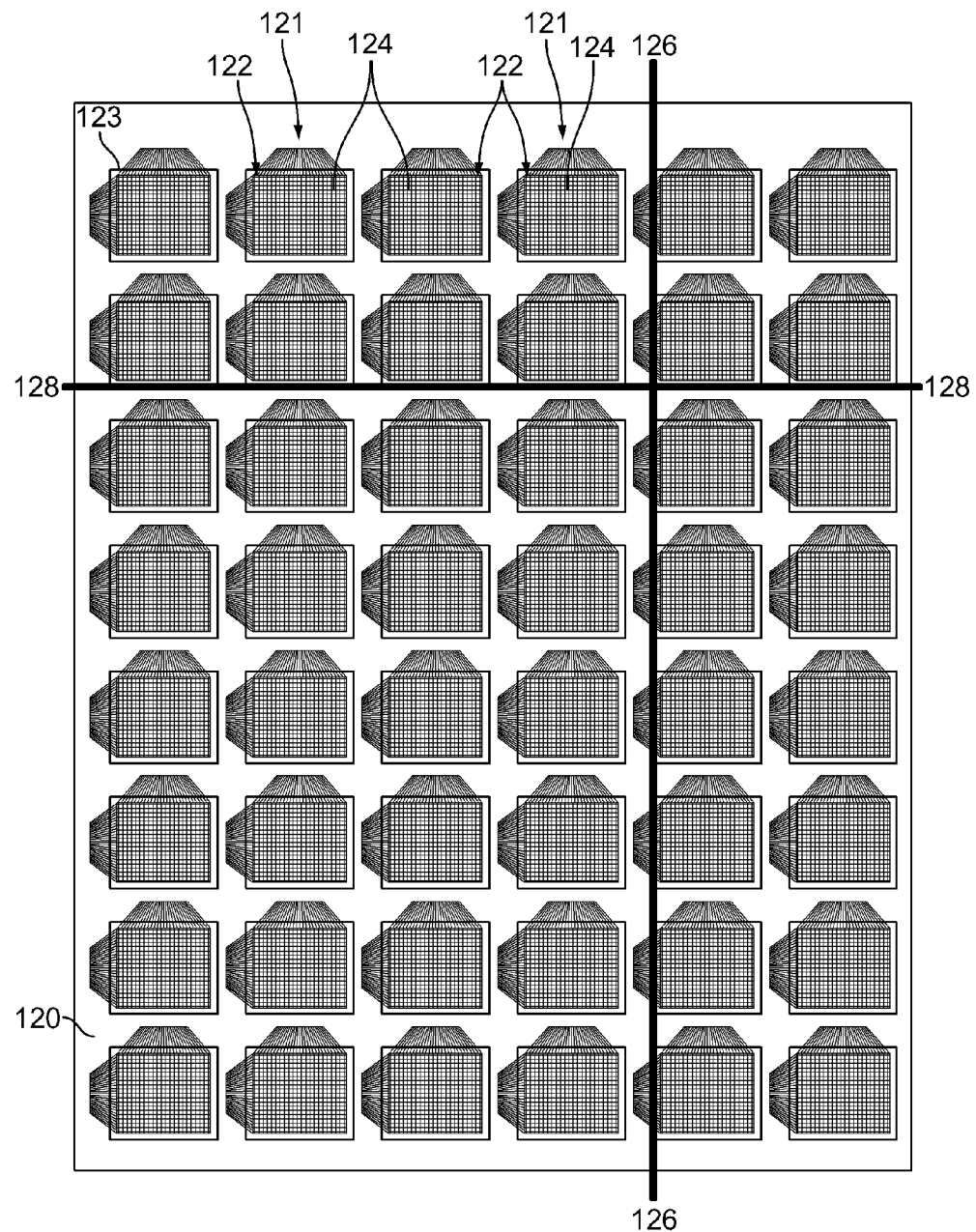
FIG. 13 shows an example of a plan view of a substrate containing multiple devices, each including an array of electromechanical systems elements.

FIG. 13 shows an example of a plan view of a substrate 120, similar to device substrate 98, containing multiple devices 121, each including an array 122 of electromechanical elements 124. In one implementation, the arrays 122 are arrays of IMODs and the devices 121 are display devices. Each array 122 is surrounded by a laser absorption layer 123 in the peripheral region of the device 121, and an antistiction layer overlies the array 122 as well as at least portions of the peripheral region, including over the laser absorption layers 123. Lasers can be scanned across columns and rows to heat segments of the laser absorption layers 123 surrounding each array 122. In some implementations multiple lasers can remove portions of the laser absorption layers 123 from multiple devices 121 in the same pass. For example, an array of lasers can remove all horizontal or x-axis portions (e.g., parallel to 128) of the laser absorption layers 123 on the substrate 120 in a single pass, while another array of lasers, or the same array of lasers, can remove all vertical or y-axis portions (e.g., parallel to 126) of the laser absorption layers 123 on the substrate 120 in another pass. In some implementations the substrate 120 can be subsequently diced to separate the devices 121.

Figure 14:
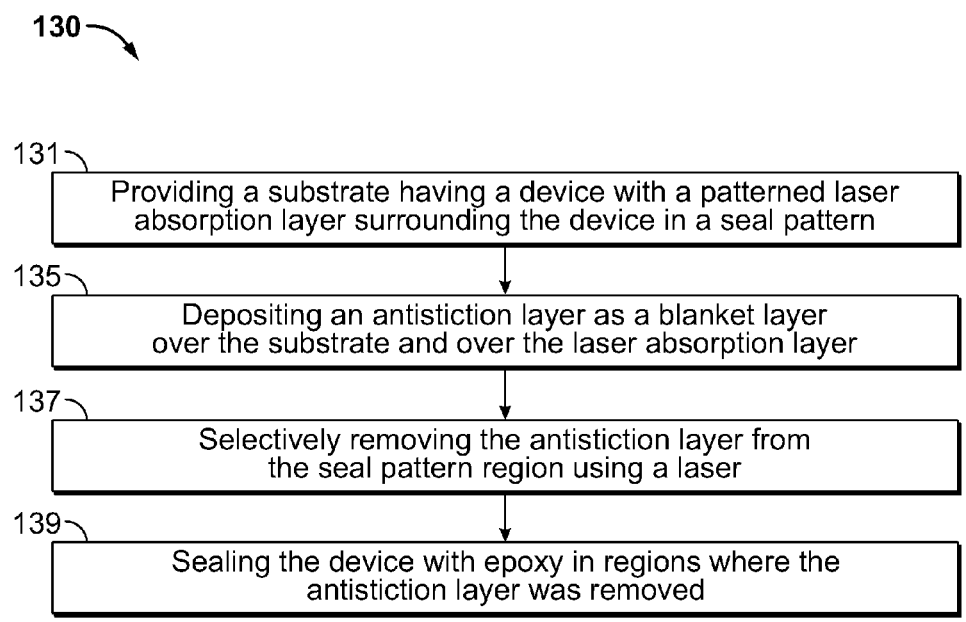
FIG. 14 shows an example of a flow diagram illustrating a method for processing an interferometric modulator.

FIG. 14 shows an example of a flow diagram illustrating a method 130 for processing an interferometric modulator. A substrate having a device with a patterned laser absorption layer surrounding the device in a seal pattern is provided at block 131. The substrate can have one or more devices in one or more active regions and a laser absorption layer formed in a seal pattern around at least one of the active regions. The active region can correspond, for example, to an array of IMODs. In some implementations, providing the substrate with the laser absorption layer formed in a seal pattern includes selectively forming the laser absorption layer in the seal pattern region. The formation of the laser absorption layer can include techniques such as screen printing, blanket deposition and photolithographic patterning and etch, or the laser absorption layer can itself be photodefinable, such that selective exposure and development will pattern it. An antistiction layer is then deposited as a blanket layer over the active region and over the laser absorption layer at block 135. The antistiction layer is removed from the seal pattern using a laser at block 137, followed by sealing the device with epoxy in the seal pattern region at block 139, after the removing of block 137.

In some implementations materials that can be removed using low-power laser energy are used as the laser absorption material. In some implementations the laser absorption material can be patterned or applied in a desired pattern. Examples of the laser absorption material include photodefinable polymers, photoresist, polyamides, and polymers. In some implementations, the laser absorption material can include materials with high absorption coefficients. In some implementations, the laser absorption material includes materials that may be ablated with a laser. In some implementations, the laser absorption material can include amorphous silicon. In some implementations the photodefinable polymers can be applied to the substrate and subsequently cured or hardened.

In some implementations the thickness of the laser absorber layer is less than about 1 µm. In some implementations the thickness of the laser absorber layer is from about 0.1 µm to about 1 µm.

In some implementations different types of lasers can be used to remove the laser absorber layer from the surface of the device. In some implementations an Excimer laser is used, such as a KrF, XeF, ArF, $XeCl_2$, or $F_2$ based laser. In some implementations, solid state lasers can be used such as a diode or YAG lasers. In some implementations, other types of lasers can be used such as gas lasers, such as $CO_2$, CO, and metal vapor based lasers.

In some implementations, various laser wavelengths can be used to remove the laser absorber material. In some implementations a laser wavelength of less than about 400 nm or less than about 300 nm is used. In some implementations a laser wavelength in the range of 150 nm to 400 nm is used, which would cover most Excimer lasers. In some implementations, a solid state laser (such as neodymium-doped YAG) can have a wavelength of about 200 nm to about 3 µm. In some implementations a laser with a longer wavelength can be used. For example $CO_2$ based lasers have a wavelength of about 10.6 µm. Longer and shorter wavelength lasers can remove the laser absorber layer by different mechanisms. For example, it is believed that longer wavelength lasers most likely have a heating effect, while shorter wavelengths can directly cut chemical bonds. Typically, photons from shorter wavelength lasers provide enough energy to break chemical bonds in organic molecules. In some implementations shorter wavelength lasers can produce a cleaner surface by removing more of the laser absorber layer than longer wavelength lasers. In some implementations the laser power or laser power density is selected to remove the laser absorption layer.

An inert atmosphere can be provided to the reaction space when the laser selectively removes the laser absorption layer. For example, nitrogen, argon, helium, other noble gases, or other inert gases can be provided to the reaction space. The use of an inert gas can reduce any ozone generated during removal of the absorption layer compared to laser use under standard atmospheric conditions.

In some implementations multiple pulses of the laser is used to remove the material. In some implementations less than about 10 pulses are used to remove the laser absorber layer. In some implementations less than about 5 pulses are used to remove the laser absorber layer. In some implementations less than about 3 pulses are used to remove the laser absorber layer. In some implementations only 1 pulse is used to remove the laser absorber layer.

In some implementations, the device substrate 98 includes a laser absorption layer and a blocker layer, for example blocker layer 99 illustrated in FIG. 12. The blocker layer 99 can be a reflector layer or stack of layers, and can be dielectric, metal, or a combination of materials. The blocker layer 99 can be used in combination with the laser absorption layer 91 (shown in FIG. 11 prior to ablation, replaced by the epoxy seal 100 in FIG. 12 after ablation), particularly in implementations using a higher power laser. The blocker layer 99 can be patterned to underlie the seal region and can be slightly wider than the overlying laser absorption layer 91. Using a higher power laser can result in the use of a lower number of pulses to remove the laser absorber layer 91. The blocker layer 99 can protect underlying materials from being damaged by the laser. Long exposure to the laser can ensure full removal of the laser absorption layer 91 and overlying portions of the antistiction layer 93, but may damage structures below the laser absorption layer 91. Typically metal layers will be damaged by exposure to the laser energy, so interconnects 92 can be damaged by the laser. The blocker layer 99 can be deposited prior to release and is located underneath the laser absorption layer 91.

In some implementations a dielectric layer or film such as a Bragg reflector can be designed to reflect a specific laser wavelength. In some cases multiple layers can be used for the blocker layer 99. In some implementations the blocker layer 99 can include multiple alternating layers of silicon dioxide and silicon oxynitride (or other dielectrics with different indices of refraction) in a quarter-wavelength stack, in which the thickness of each layer is about ¼ of the laser wavelength. That is, the blocker layer 99 can be a ¼λ dielectric stack. In some implementations, the blocker layer 99 includes at least one pair of quarter-wavelength layers, with each layer in the pair having a different index of refraction.

With reference again to FIG. 12, in some implementations an apparatus or device 89 is provided that includes a device substrate 98 bonded to a backplate 101 with an epoxy seal 100, thereby defining a portion of the device substrate 98 that is inside the epoxy seal 100. It will be understood that the backplate 101 is bonded to the device substrate 98 even though the epoxy seal 100 does not directly contact the device substrate 98. At least one electromechanical systems device is inside the epoxy seal 100. An antistiction layer 93 covers the active region of the substrate 98 inside the epoxy seal 100, while there is no antistiction layer between the epoxy sealing material and the device substrate 98. The epoxy seal 100 is used to secure a backplate 101 with the substrate. The backplate 101 is directly over and contacts the epoxy sealing material 100. The epoxy seal 100 between the backplate 101 and substrate 98 is stronger without the antistiction layer 93 present between the epoxy seal 100 and substrate 98. In the illustrated implementation, the epoxy seals directly to an intervening layer, particularly the insulating layer 97, which underlies the antistiction layer 93 outside of the seal region and which exhibits high adhesion to the epoxy seal 100.

In some implementations an apparatus is provided, including a substrate; a plurality of electromechanical systems elements arranged in an array on the substrate; a means for reducing adhesion over the array and outside the array; a means for sealing in a sealing pattern surrounding array; and a backplate sealed to the substrate by the means for sealing. In some implementations, the means for sealing includes epoxy and an absence of the means for reducing adhesion in that region. In some implementations, the means for reducing adhesion includes a self-assembled monolayer (SAM). In some implementations the means for reducing adhesion includes a self-assembled monolayer (SAM) and a layer formed by atomic layer deposition.

Figure 15A:
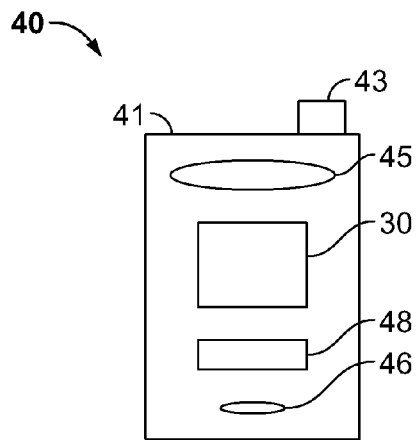
FIGS. 15A and 15B show examples of system block diagrams illustrating a display device that includes a plurality of interferometric modulators.
Figure 15B:
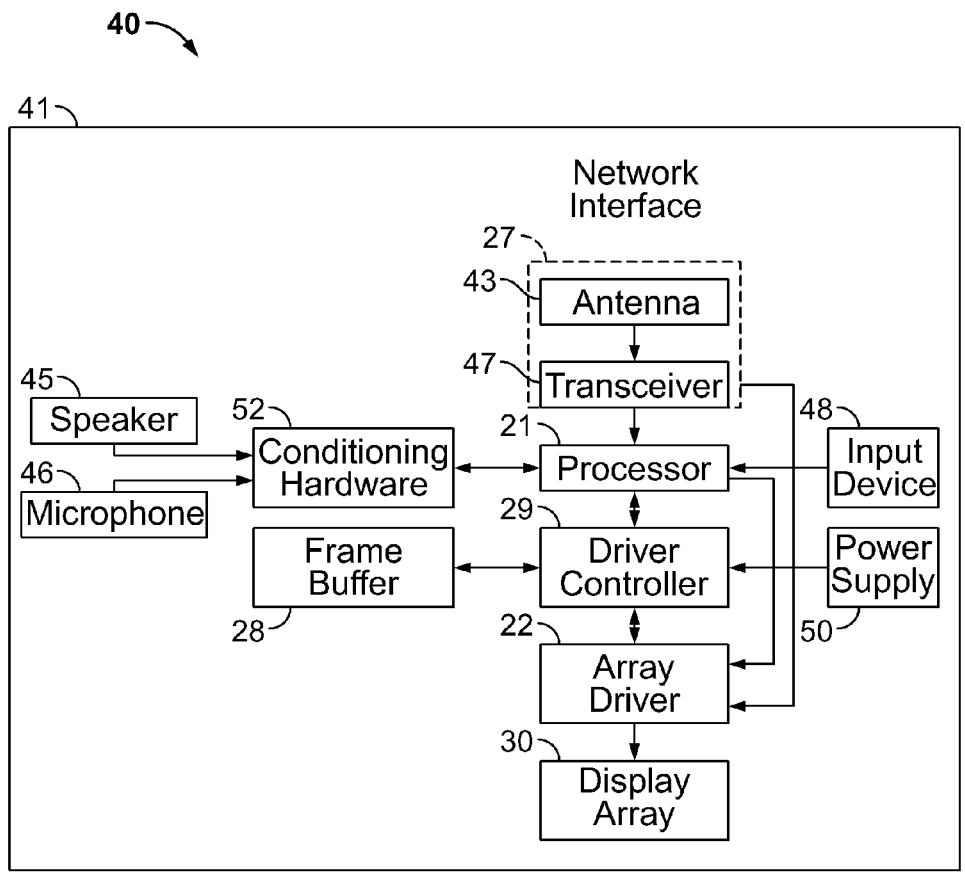

FIGS. 15A and 15B show examples of system block diagrams illustrating a display device 40 that includes a plurality of interferometric modulators. The display device 40 includes an antistiction layer patterned to be absent from a sealing region surrounding the array of IMODs, as described above. The display device 40 can be, for example, a cellular or mobile telephone. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 14B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 can provide power to all components as required by the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver). Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method for selectively removing an antistiction layer in an electromechanical systems apparatus, comprising:
   providing a substrate having a device with a patterned laser absorption layer surrounding the device in a seal pattern;
   depositing an antistiction layer as a blanket layer over the substrate and over the laser absorption layer after providing the substrate with the patterned laser absorption layer;
   selectively removing the antistiction layer from the seal pattern using a laser; and
   sealing the device with epoxy in regions where the antistiction layer was removed.

2. The method of claim 1, wherein providing comprises selectively forming the patterned laser absorption layer in the seal pattern region surrounding the device.

3. The method of claim 1, wherein selectively removing the antistiction layer includes selectively removing the laser absorption layer using the laser.

4. The method of claim 3, wherein the laser absorption layer and overlying portions of the antistiction layer are removed using less than 10 pulses of the laser.

5. The method of claim 4, wherein the laser absorption layer and overlying portions of the antistiction layer are removed using less than 3 pulses of the laser.

6. The method of claim 1, wherein the laser absorption layer is a photodefinable polymer.

7. The method of claim 1, further including providing a blocker layer between the laser absorption layer and an underlying metal feature, the blocker layer configured to protect the metal feature from laser damage during the selectively removing.

8. The method of claim 1, wherein the laser absorption layer has a thickness and material configured to absorb the wavelength of the laser such that the laser ablates the laser absorption layer to remove the antistiction layer.

9. The method of claim 1, wherein the laser absorption layer is directly under the antistiction layer.

10. The method of claim 1, wherein depositing the antistiction layer comprises depositing an atomic layer deposition (ALD) layer and forming a self-assembled monolayer (SAM) over the ALD layer.

11. The method of claim 10, wherein a total thickness of the antistiction layer is less than about 110 Å.

12. The method of claim 11, wherein the ALD layer includes aluminum oxide.

13. The method of claim 11, wherein the SAM layer includes a layer of an organic monomer with a hydrophobic end and a hydrophilic end.

14. The method of claim 1, wherein the laser includes at least one of: Excimer lasers, solid state lasers, gas lasers, and metal vapor lasers.

15. The method of claim 1, wherein the laser has a wavelength of less than about 400 nm.

16. The method of claim 1, further including providing an inert atmosphere to the apparatus during selectively removing with the laser.

17. The method of claim 1, wherein the device includes an array of interferometric modulators, and the laser absorption layer and the epoxy are formed in regions where the antistiction layer is removed.

* * * * *